United States Patent [19]

Sanderson et al.

[11] Patent Number: 4,794,259
[45] Date of Patent: Dec. 27, 1988

[54] CHARGED PARTICLE COLLECTION

[75] Inventors: Allan Sanderson; Colin N. Ribton, both of Cambridge, England

[73] Assignee: The Welding Institute, Cambridge, England

[21] Appl. No.: 27,829

[22] Filed: Mar. 19, 1987

[30] Foreign Application Priority Data

Mar. 24, 1986 [GB] United Kingdom ............... 8607222

[51] Int. Cl.⁴ ........................................... H01J 37/244
[52] U.S. Cl. .................................... 250/397; 250/310; 250/305; 219/121.3
[58] Field of Search ...................... 250/397, 310, 305; 219/121 EW

[56] References Cited

U.S. PATENT DOCUMENTS

Re. 27,005 12/1970 Wingfield et al. ................. 250/310
4,400,609 8/1983 Pastushenko et al. ...... 219/121 EW
4,587,425 5/1986 Plows .................................. 250/397

FOREIGN PATENT DOCUMENTS 56-48050 5/1981 Japan .................................. 250/397

Primary Examiner—Anderson, Bruce C.
Assistant Examiner—Jack I. Berman
Attorney, Agent, or Firm—Martin M. Novack

[57] ABSTRACT

A charged particle collector assembly, particularly for use with an electron beam gun, is described. The assembly comprises a reflection member onto which electrons impinge in use, the reflection member being adapted substantially to absorb particles of one polarity and substantially to reflect particles of the other polarity. A sensor or collector is positioned to receive particles reflected from the reflection member and to generate a corresponding output signal.

15 Claims, 15 Drawing Sheets

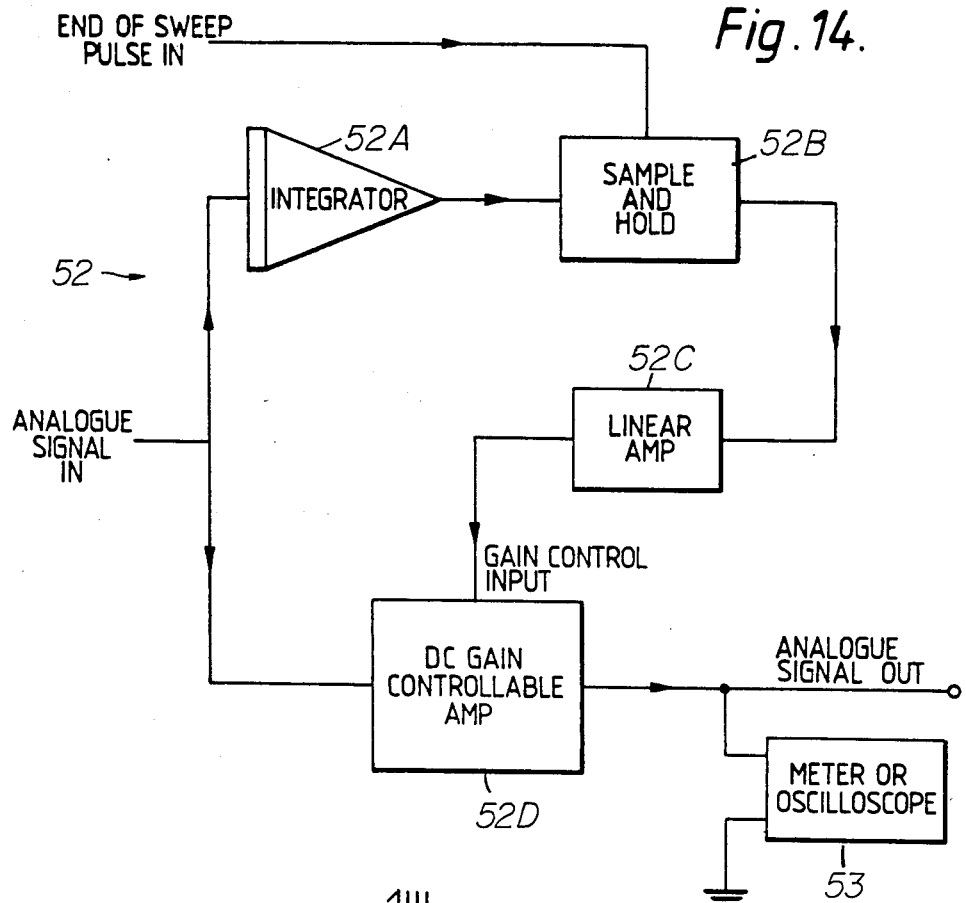
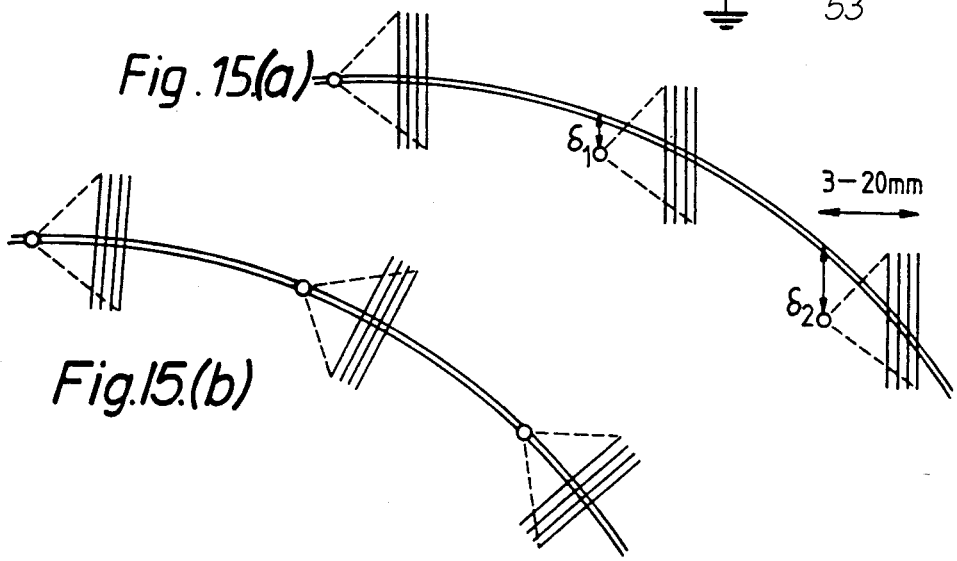

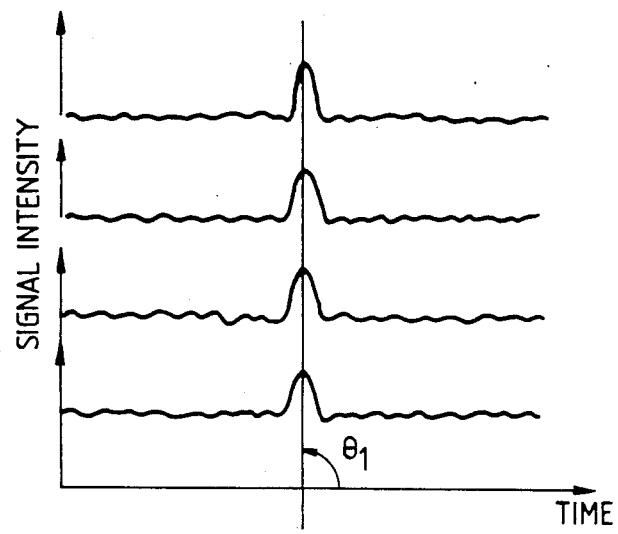
Fig. 16.
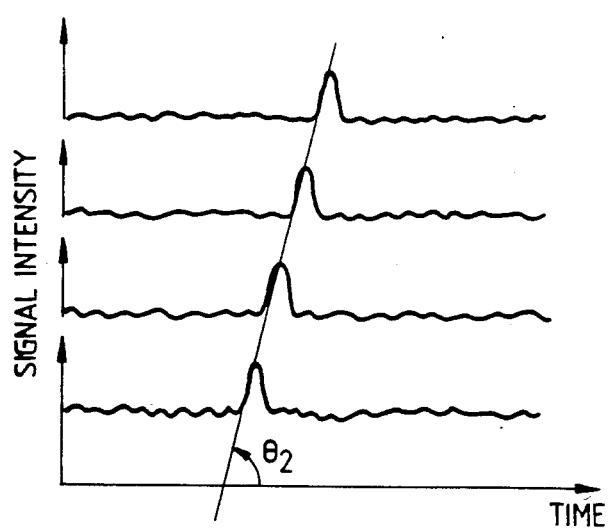

CHARGED PARTICLE COLLECTION

FIELD OF THE INVENTION

The invention relates to apparatus and methods for the collection of charged particles. These have application to the detection, signal processing and utilisation of back-scattered charged particles for purposes of generating images, process monitoring and beam focusing, and in the processing and examination of material workpieces using charged particle beams.

DESCRIPTION OF THE PRIOR ART

When a charged particle beam consisting of particles such as electrons impinges on the surface of a material, a fraction of the particles are back-scattered. The numerical value of the fraction is dependent on the angle of incidence of the beam on the workpiece, the atomic numbers of the workpiece elemental constituents, and the energy of the incident particle beam.

In the case of an impinging electron beam, the energy of the back-scattered electrons can be described as a continuous spectrum varying from a fraction of an electron volt to the full incident energy of the electrons in the primary beam. In addition if the workpiece material is sufficiently excited by the incident beam, positive ions can be generated which are scattered back in approximately the same direction as the back-scattered electrons. This is particularly true if the workpiece is raised to an elevated temperature by the incident beam, and especially if melting and vaporisation takes place as in the case of metal processing methods such as electron beam welding.

The proportion of the back-scattered electrons is also dependent on the workpiece topography. If the electrons impinge on any part of the workpiece which is not substantially normal with respect to the incident beam, then the back-scattered electrons are generally directed away from the source of the incident beam. This phenomenon is made use of in devices such as scanning electron microscopes where very high contrast electron-images can be produced. In such devices the primary electron beam is scanned in a raster mode over the workpiece surface and the back-scattered electron current, collected by a simple detector placed above the workpiece surface, may be used to modulate the brightness of a synchronous raster on a TV monitor. A similar approach has been attempted for collection of back-scattered electrons in EB welding equipment.

Various attempts have been made to produce electron images from this mixture of particle types and energies by employing a simple collector plate where some of the back-streaming negative and positive particles are collected and summed on the collector plate to form a video brightness modulation signal. Unfortunately because the proportion and total number of electrons and positive ions contiously fluctuates with the primary beam current and workpiece temperature (in the case where heating, melting and vaporisation are taking place) the signal is erratic, complicated and fluctuates with a wide range of amplitude and frequency. In addition, it has been found that for situations where large quantities of positive ions are generated, for example in the case of welding at high beam power above say 4kW, especially where strong ionisation of the metal vapour takes place, the quantity of positive charge reaching the collector in the form of ions can greatly reduce, and in some cases cancel or even exceed, the negative charge resulting from the back-scattered electrons. In these situations the summed collector particle current is extremely erratic and cannot easily be usefully employed for image formation, seam tracking, beam focusing or process monitoring. Some attempts have been made to eliminate the positive and low voltage electrons from the detected back-streaming particle beam by the use of negatively charged grid surrounding the collector plate, but this has not been found to be fully satisfactory especially at high beam power, above say 4 kW. In particular it has been found that the fineness of the mesh and level of biasing voltage required are not always compatible with the working environment. For example, for electron beam welding the amount of fused metal spatter and vapour given off causes rapid clogging of a fine wire grid whereas the use of a coarse grid in conjunction with higher biasing voltage such as 200 V to remove positive ions, can often result in the shorting out of the grid potential by the ionised gases and metal vapour.

SUMMARY OF THE INVENTION

In accordance with one aspect of the present invention, a charged particle collector assembly comprises a reflection member onto which charged particles impinge in use, the reflection member being adapted substantially to absorb particles of one polarity and substantially to reflect particles of the other polarity; and a sensor positioned to receive particles reflected from the reflection member and to generate a corresponding output signal.

The invention overcomes the problems outlined above by positioning the sensor, such as a conventional collector, so that charged particles must first impinge on the reflection member before they reach the sensor.

The collector assembly is conveniently associated with a charged particle generator such as an electron beam generator designed for welding, scanning, or other applications. The ability of the collector assembly to isolate particles of the one polarity and, commonly, low energy particles of the other polarity enables considerable increases in signal integrity to be obtained.

In the present invention a radically different approach has been adopted. The back-scattered particles are caused to impinge on a reflecting surface. This has the effect of reflecting the high energy electrons onto a "hidden" sensor whilst absorbing a proportion of the, for example, positive ions and low voltage electrons. The high energy electrons are collected and then routed to novel processing circuits as described below.

The present invention allows the monitoring of features to be extended to the situation where the charged particle beam is of sufficient power density and power level to cause melting and/or vaporisation of the workpiece (substrate) surface as in the case of for example electron beam welding. In this situation the particle stream emerging from the workpiece consists of a complex mixture of electrons covering a very wide range of energies together with copious volumes of positive ions of varying energy.

The sensor, which typically comprises one or more plates, may be positioned "on edge" so that there is substantially no direct line of sight between the source of the particles and the majority of the surface of the sensor. Preferably, however, the assembly further comprises a shield arranged to prevent charged particles from directly impinging on the sensor.

Preferably, the assembly further comprises means for applying a potential to the reflection member having the same polarity as particles to be reflected. This has a dual effect of increasing the degree of absorbence of particles of the one polarity and increasing the degree of reflection of particles of the other polarity.

The electron reflectivity of the reflector may be increased if it is made of a material having a relatively high atomic number, for example greater than 50. The electron collecting ability of the sensor may be increased by making it of a material having a relatively low atomic number.

Preferably, the reflector is curved so that the size of the sensor can be minimised.

It should be understood that although the sensor could comprise a single member, typically the sensor will comprise a plurality of separate members. These members may be annually arranged and/or axially arranged.

In accordance with a second aspect of the present invention, a method of controlling the impingement of a beam of charged particle on a workpiece having an elongate feature comprises causing relative movement between the beam and the workpiece whereby the beam impinges on successive primary positions along the elongate feature; causing the beam periodically to scan across the elongate feature at an advanced position relatively to the corresponding primary position; collecting charged particles scattered by the workpiece during the scanning step in an assembly according to the first aspect of the present invention; and monitoring signals generated by the sensor of the assembly.

This aspect of the invention is particularly useful in the case of charged particle beam welding and related techniques including existing weld modification since it enables real time seam tracking to be achieved. For example, the monitored signals could be used, if necessary after modification, to control a video display from which an operator can determine how to control the relative movement between the beam and the workpiece so that the primary positions of the beam remain on the elongate feature, such as a seam or joint line. Alternatively, or additionally, the monitored signals could be used in a feedback circuit to control directly the relative movement between the beam and the workpiece.

Preferably, in the case of charged particle beam welding, for example electron beam welding, the power of the beam is reduced during the scanning step.

Conveniently, the method further comprises collecting charged particles scattered by the workpiece when the beam impinges on a primary position. In the case of welding this allows an image of the weld pool itself to be obtained.

It will be appreciated that the invention has many applications not only to seam tracking as described above, but also to more general electron-imaging techniques, process monitoring, and beam focussing.

BRIEF DESCRIPTION OF THE DRAWINGS

Some examples of methods and apparatus in accordance with the present invention will now be described and contrasted with known apparatus with reference to the accompanying drawings, in which:

FIG. 5a illustrates an example of a collector of an assembly according to the invention and FIGS. 5b-5e illustrate four alternative arrangements for electrically connecting elements of the collector shown in FIG. 5a;

FIG. 14 is a block diagram of the automatic gain amplifier shown in FIG. 13;

FIG. 15 illustrates two examples of an electron beam scanning across a curved joint line; and, FIG. 16 illustrates graphically output signals corresponding to the scans illustrated in FIG. 15.

DETAILED DESCRIPTION OF THE EMBODIMENTS

Figure 1:
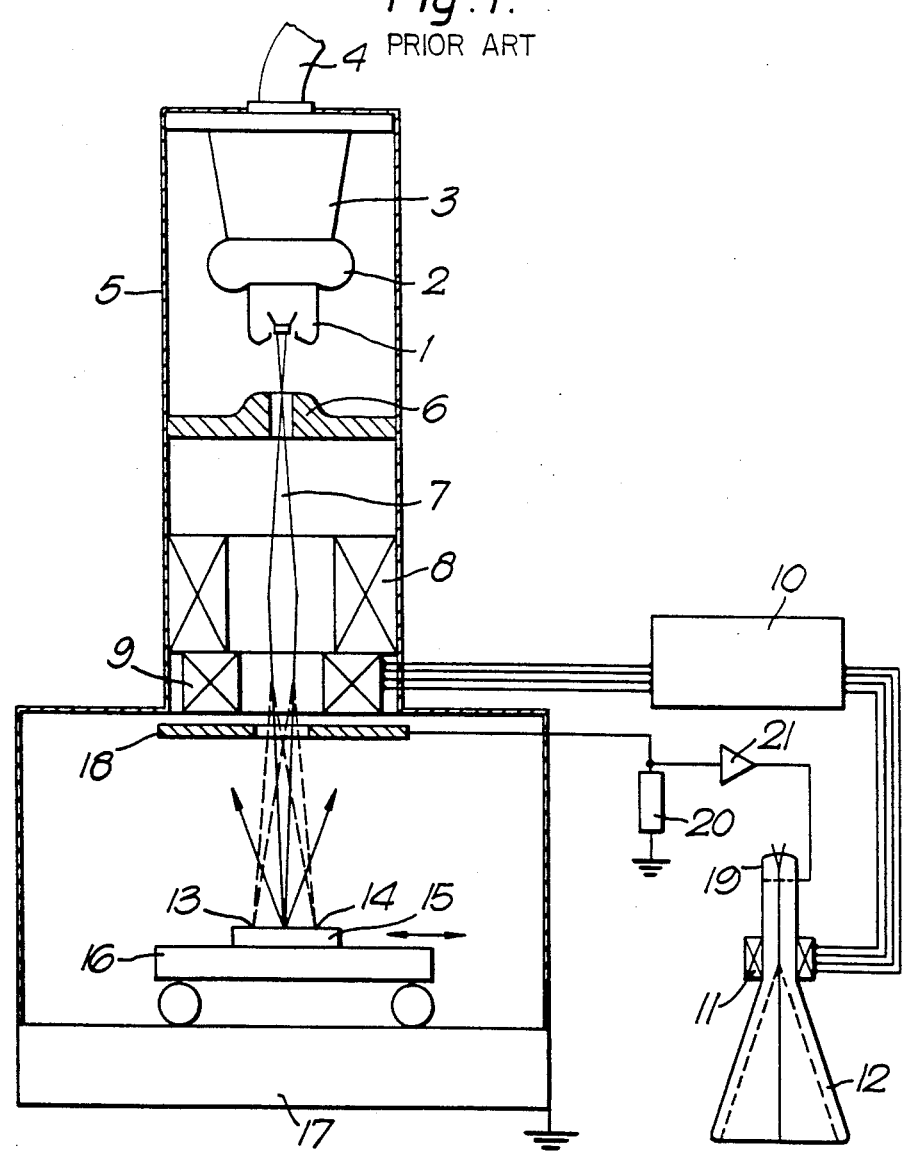
FIGS. 1 and 2 illustrate two examples of known electron beam welding apparatus.

The electron beam welding apparatus illustrated in FIG. 1 comprises an electron beam gun 1 mounted on a corona ring 2 connected with a high voltage termination 3 supplied via a high voltage cable 4. An evacuated housing 5 surrounds these elements.

An anode 6 is positioned in alignment with the gun 1 through which a beam of electrons 7 passes in use. The beam passes between an electro-magnetic lens system 8 and electromagnetic deflection coils 9. The deflection coils 9 are connected to a deflection function generator 10 which is also connected with the deflection coils 11 of a cathode ray tube (CRT) 12. The generator 10 controls the deflection coils 9 and the deflection coils 11 so that the beam scans between two extreme positions 13, 14 in raster fashion in synchronism with the scanning of the CRT spot.

The electron beam 7 impinges on a workpiece 15 having a joint line (not shown in FIG. 1) supported on a traverse mechanism 16. The workpiece 15 and traverse mechanism 16 are positioned within a vacuum chamber 17 sealed to the housing 5.

An annular collector 18 is mounted adjacent the deflection coils 9 and is electrically connected to the electron source 19 of the CRT 12 via a resistor 20 and amplifier 21.

In operation, impingement of the electron beam 7 on the workpiece 15 causes negative and positive particles to be back-scattered towards the collector 18. Impingement of these particles or ions on the collector 18 causes a current to be generated which after conversion to a suitable potential is applied to the electron source 19 of the CRT 12. Unfortunately, as mentioned previously, because the relative proportions in total numbers of electrons and positive ions continuously fluctuates this control signal is erratic.

Figure 2:
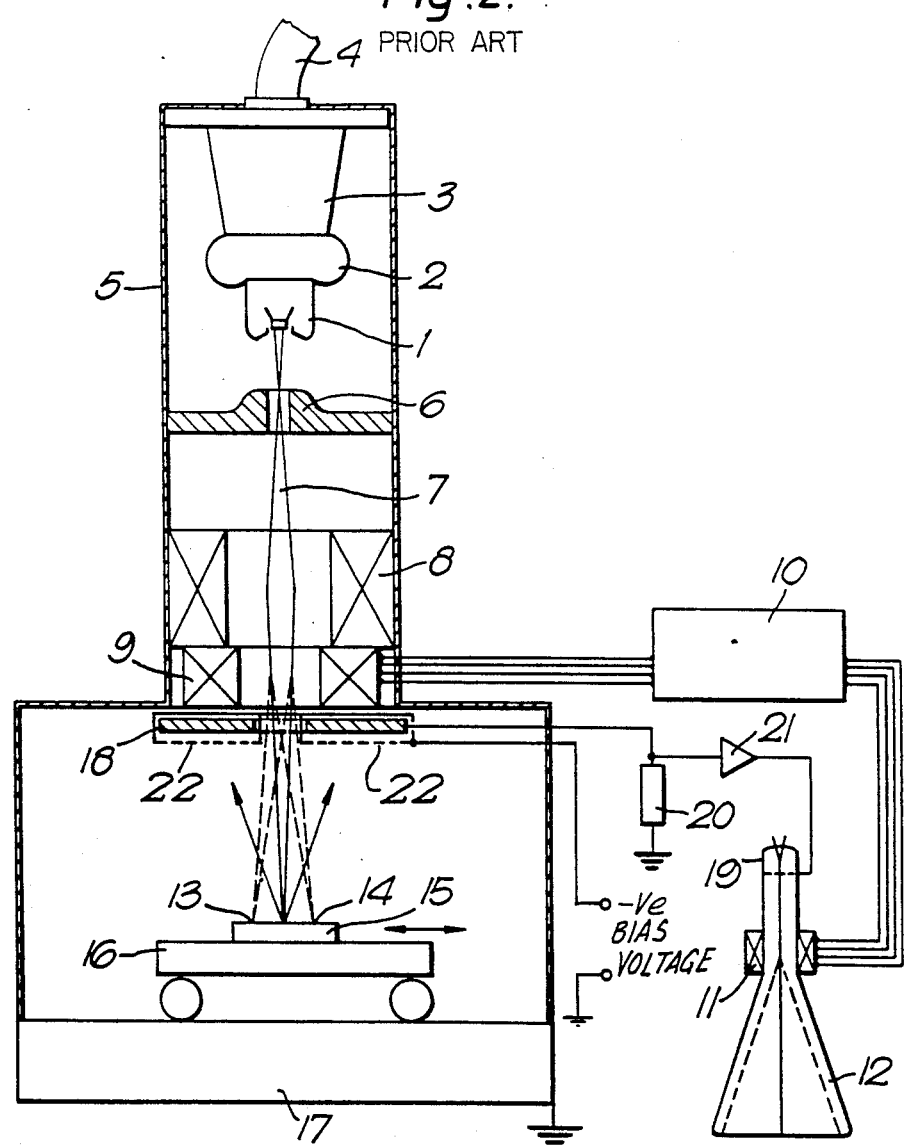

An attempt to improve the situation is illustrated in FIG. 2 which is identical to FIG. 1 except for the provision of a metal grid 22 around the collector plate 18. The application of a negative bias potential to the grid 22 assists in preventing positive ions and low energy electrons from impinging on the collector plate 18. However, in practice it is found that a relatively high bias potential is required or a relatively fine grid must be used. The first option leads to the danger of shorting between the grid 22 and the collector plate 18 while the second option leads to the build up of spatter on the grid.

Figure 3:
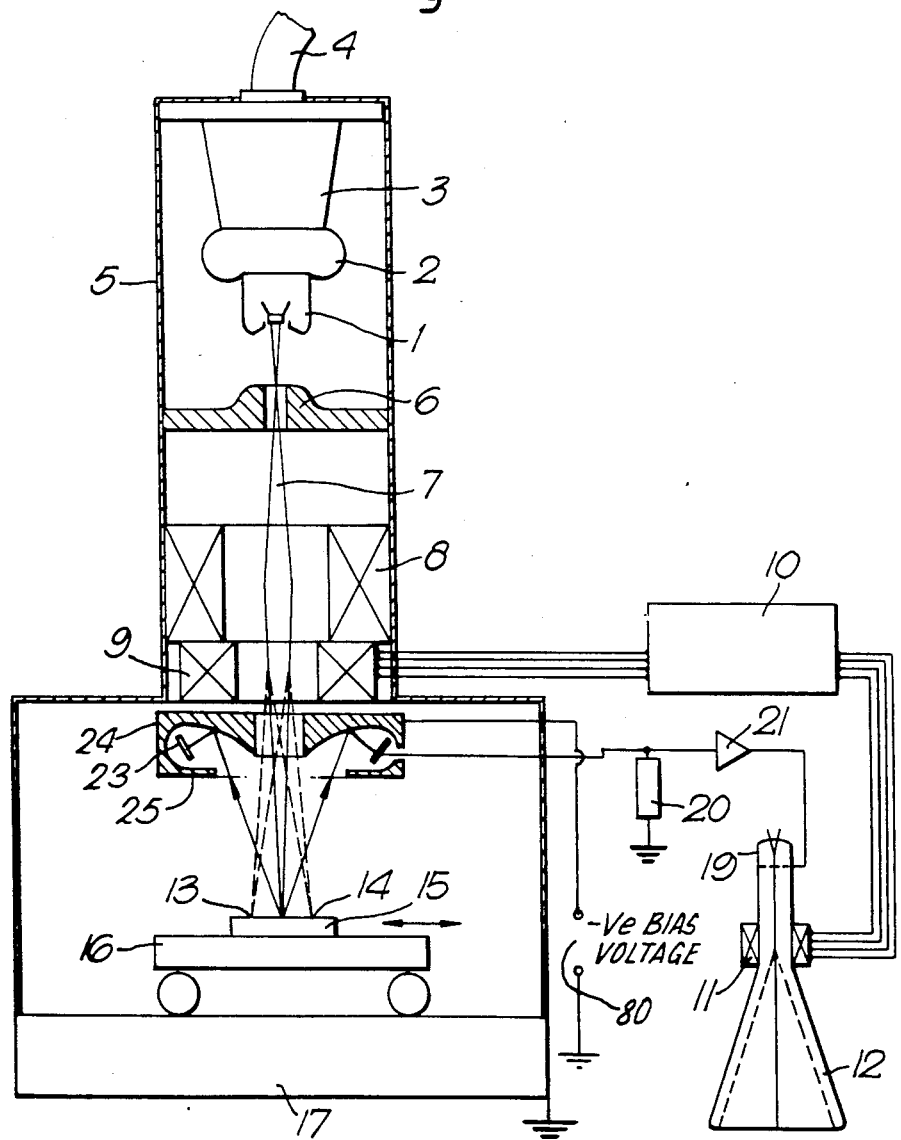
FIG. 3 illustrates a first example of electron beam welding apparatus in accordance with the invention.

FIG. 3 shows a first example of the invention. In this example high energy electrons are reflected by the internal surface of a reentrant cavity of a reflector 24 and are collected by a strategically placed annular collector ring 23. The line of sight between the workpiece 15 and the collector 23 is blocked by a disc shaped guard member 25. By suitably curving the reflector surfaces the maximum number of electrons are collected and directed onto the collector annulus. The reflecting surfaces are also shaped and positioned to permit the device to work over a wide working distance range for the main beam between coils 9 and workpiece 15 e.g. from 100 mm to 1000 mm.

The collector (or collectors) (FIG. 3) are positioned behind a metal shield or guard member 25.

This blocks the direct line of sight from the point of emission on the workpiece to the collector. This approach has been found to greatly improve the quality of the collector signal. In addition the separation effect can be greatly enhanced by biasing the reflecting surfaces negative with respect to the workpiece which is at earth potential by connecting the surfaces to a bias voltage source 80. In this case, the negative potential causes a very substantially reduction in the number of positive ions reaching the collector(s) and also serves to deflect relatively slow moving electrons away from the collector(s).

Figure 4A:
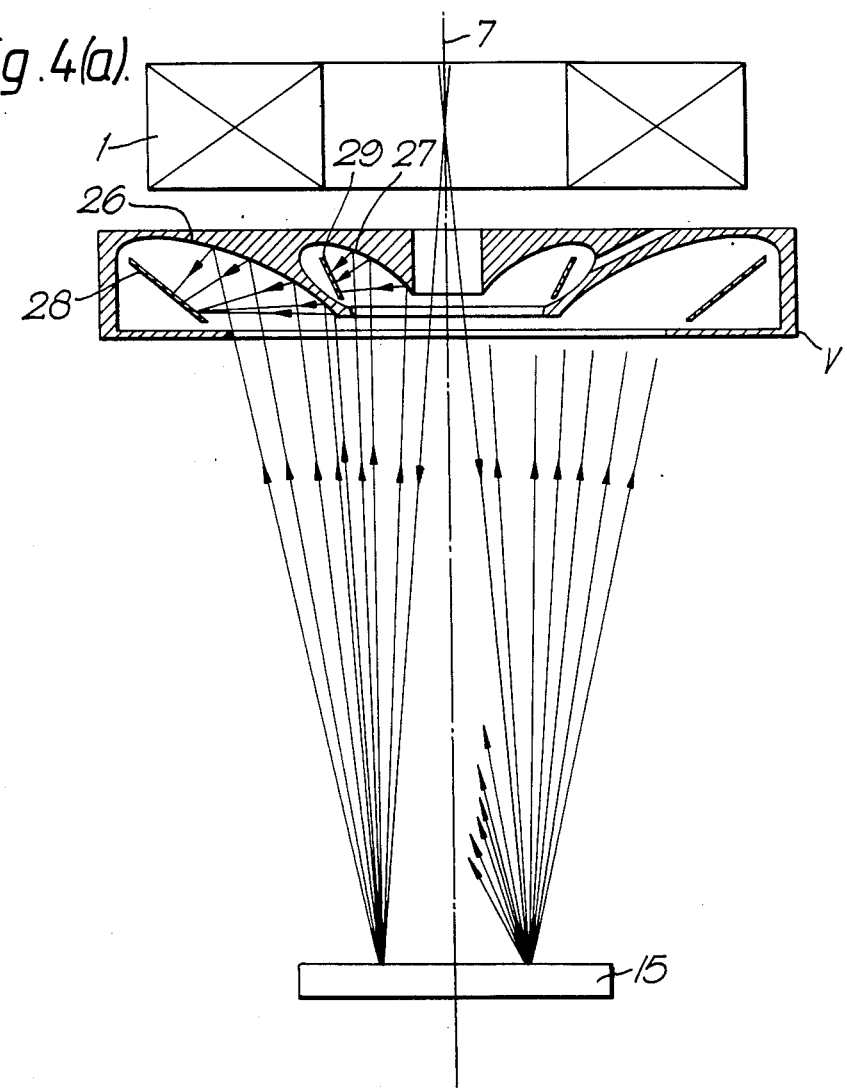
FIGS. 4a and 4b illustrate part of a second example of electron beam welding apparatus according to the invention.
Figure 4B:
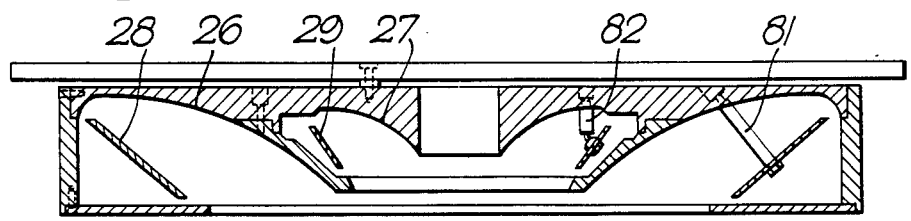

In another (nested) form of the invention (FIGS. 4a&b) two annular reflectors 26, 27 and cooperating collector plates 28, 29 allow differential signal conditioning to be used to achieve greater contrast, some immunity from signal level shifting, and noise reduction. FIG. 4a shows the general arrangement and FIG. 4b a typical example of a collector structure built for a large high power EB welding gun column in which the collector plates are mounted to the remainder of the structure by brackets 81, 82.

Figure 5:
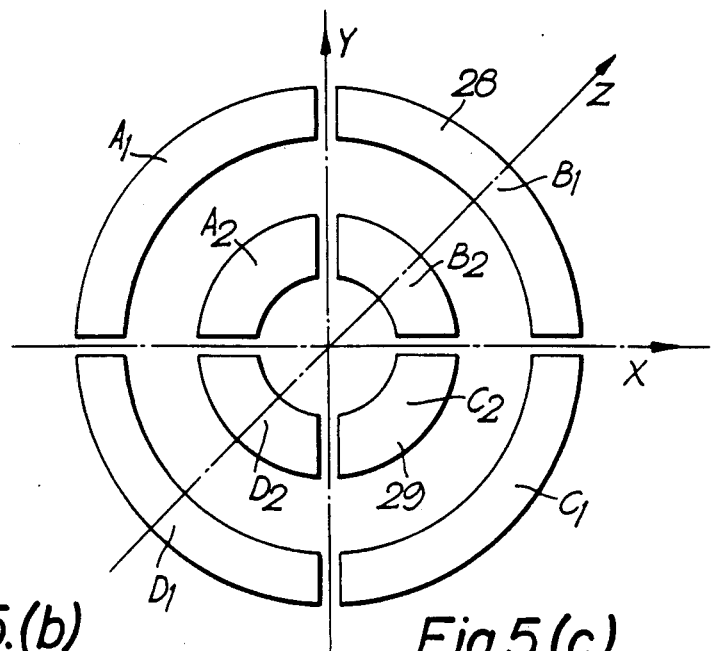
Figure 5:
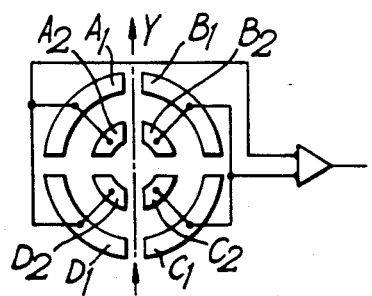
Figure 5:
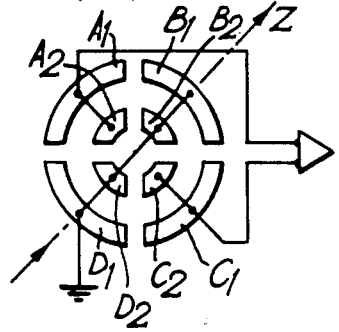
Figure 5:
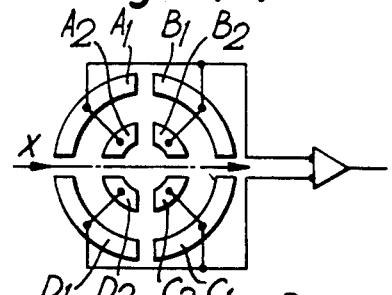
Figure 5:
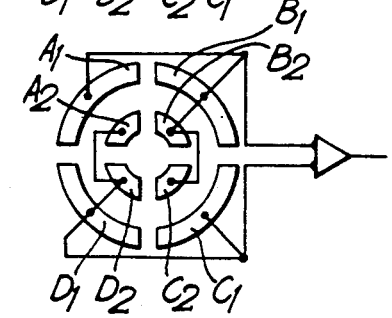

In another form of the invention the annular collector elements 28, 29 can be divided into a number of circularly and radially spaced sections (e.g. $A_1$, $A_2$, $B_1$, $B_2$, $C_1$, $C_2$, $D_1$, $D_2$ in FIG. 5a) and the signals summed or subtracted in such a way to improve image contrast and to achieve better topographic image relief. By way of illustration the following examples are described. When the workpiece feature to be viewed lies parallel to the gun column detector orientation as shown by the arrow Y the signals are summed and differenced as shown in FIG. 5b.

Signal Output $S = A_1 + A_2 + D_1 + D_2 - B_1 - B_2 - C_1 - C_2$

This provides maximum differential contrast for a joint detail such as a groove, linear notch or linear chamfer which is oriented parallel to the Y direction.

Whereas if the feature direction is as indicated by the arrow X, the segment signals are summed and differenced as shown in FIG. 5c.

Signal Output $S = A_1 + A_2 + B_1 + B_2 - C_1 - C_2 - D_1 - D_2$

In cases where the groove, linear notch or linear chamfer is oriented at an angle of approximately 45° to the segment edges, as indicated by the arrow Z, the signals are summed and differenced as shown in FIG. 5d.

Signal Output $= A_1 + A_2 - C_1 - C_2$ and segments $D_1, D_2, B_1, B_2$ are grounded.

For the three examples above, the approach is best suited to the situation where high contrast is required e.g. for seam tracking of a linear joint line feature. For generation of electron (grey scale) images, to produce good topographic relief, where the feature being viewed has no particular orientation, the signals can be summed and differenced for example by the expression Signal Output $= A_1 + B_1 - C_1 - D_1 - A_2 + B_2 + C_2 - D_2$ See FIG. 5e.

Of course if the detector is to be used for a wide variety of applications it is most convenient to make the annular segment connections outside the vacuum system so that they can be varied as necessary.

Figure 6:
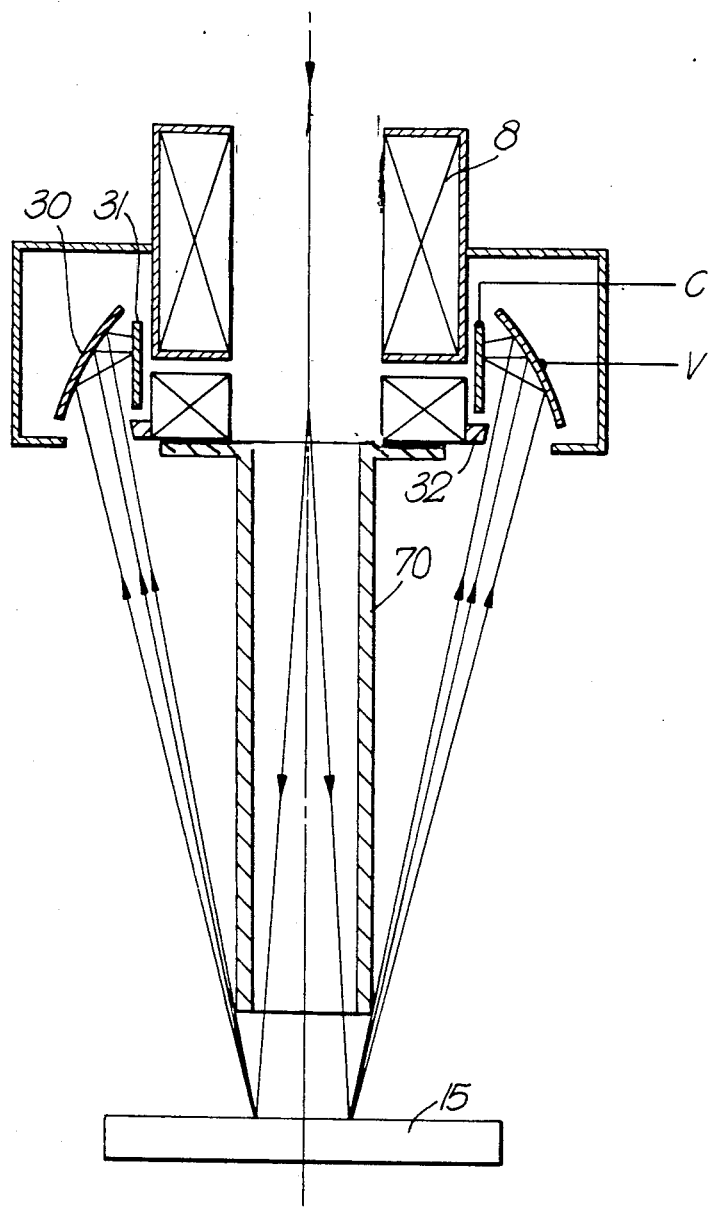
FIGS. 6-9 illustrate parts of third to seventh examples of assemblies according to the invention.

In yet another form of the invention, reflecting surfaces 30 (which may be annular or provided as an opposed pair) appear as cylindrical members surrounding the lower electron optical elements (e.g. lens coil 8 and deflection coil units 9) of the electron column, FIG. 6. This is particularly useful where the gun column is of relatively small diameter and where it is important to minimise the gun column length. Each reflector 30 reflects high energy electrons onto a respective collector 31, shielded from a direct line of sight by a plate 32.

In this example, a magnetic shield 70 extends from within the coils 8,9 to a position adjacent the workpiece 15. This is important, particularly where the apparatus is used in seam tracking (FIG. 10) to reduce the effects of stray magnetic fields on the electron beam. Such a shield could be used in any of the other examples described.

Figure 7:
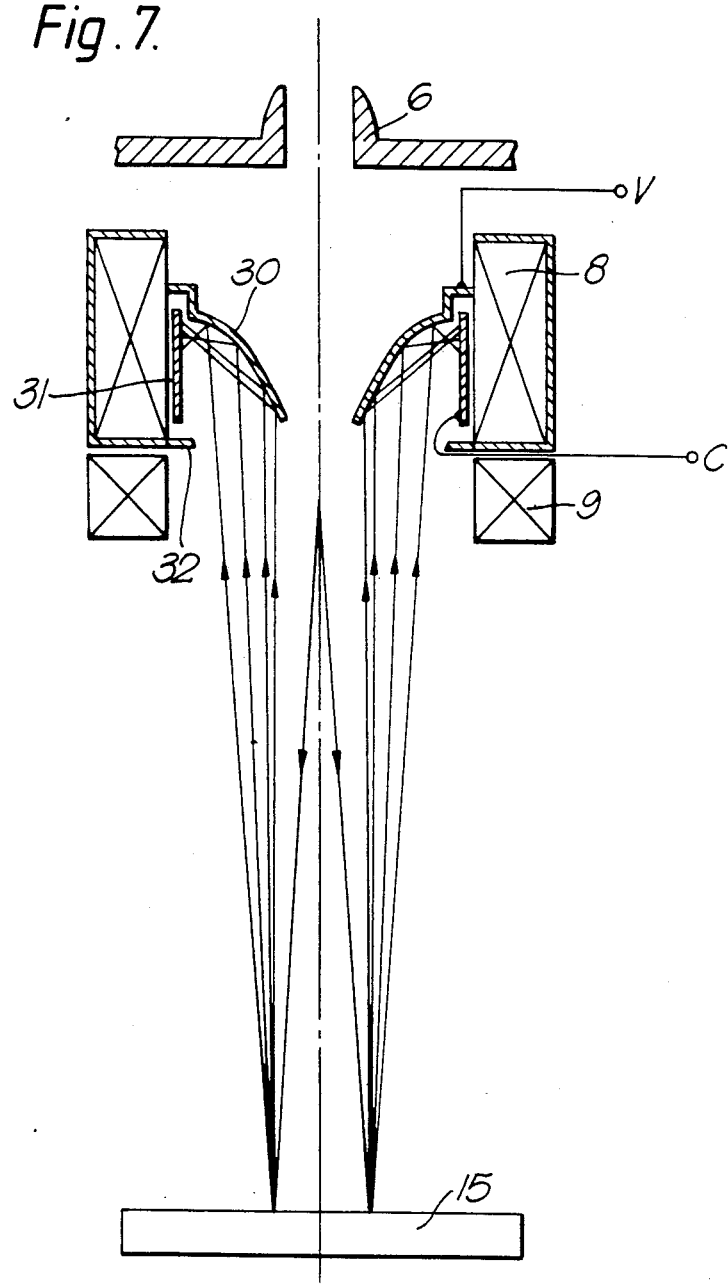

In an alternative arrangement, where space permits, the detector system can be built inside the electron column as shown in FIG. 7. The detector system could be placed radially inwardly of the lens 8 (as shown) or between the lens 8 and anode plate 6. However, in this case some interference and particle deflection would be expected from the electromagnetic lens and deflection coils system.

Figure 8:
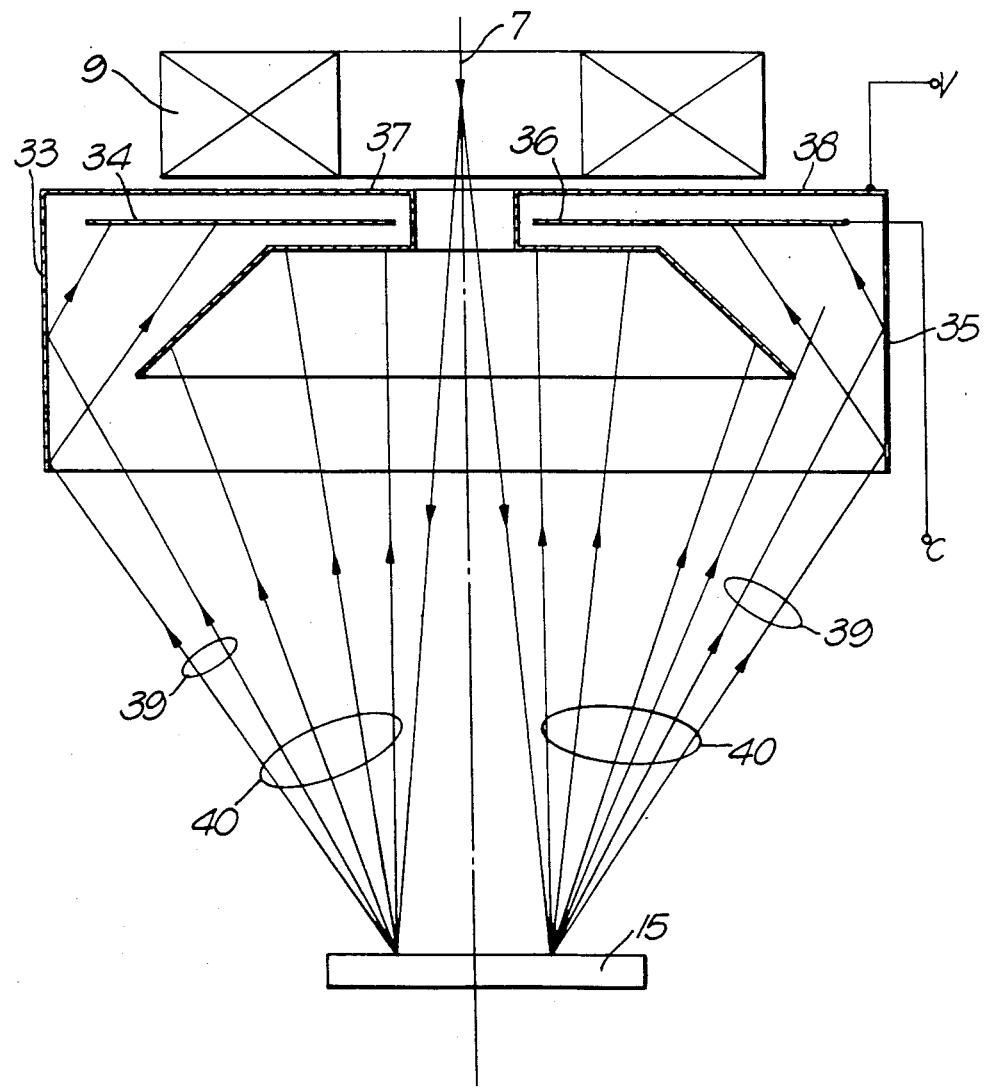

In yet another version of the invention the reflecting surfaces and collector can appear as simple opposed pairs 33, 34; 35, 36 as shown in FIG. 8. The reflecting surfaces 33, 35 form part of respective opposed casings 37, 38 which nearly surround the respective collectors 34, 36. It will be seen therefore that only a proportion indicated at 39 out of all the back-scattered electrons 40 will be reflected onto the collectors 34, 36. It has been found, however, that this arrangement is effective since it emphasises features which are in the same plane to produce a sharp pulse.

Of course the collector systems described, and variants of them, do not necessarily need to be associated with the electron beam generator and column; they could for example be attached to the vacuum chamber wall or workpiece supporting system.

Typically the reflecting surfaces in all the examples are biased to a potential of −50 V with respect to the gun column and workpiece earthy components. This voltage has been found to be adequate for operation in conjunction with an electron beam generator at an accelerating voltage of up to 150 kV and a beam current of over several hundred milliamperes, (viz in excess of 30 kW). Ideally the reflective material should be made of a high atomic number element eg copper or molybdenum or plated with such material, to increase the high energy electron back-scatter on to the collector. On the other hand, the collector material should be made of a low atomic number material (such as carbon or aluminum) in order to minimise back-scattering from itself. The collector components can also be roughened or shaped in order to maximise electron capture. These devices can be used for production of electron images, beam focusing, in-line process monitoring and for real-time seam tracking.

In the case of producing electron images the collector and detector system can be used to obtain stable, sharp images of the entire area of the workpiece surrounding the primary beam null deflection position. An annular form of the device is particularly useful since signal collection is made independent of workpiece topographic orientation around the primary beam axis. Because positive ions can be readily eliminated it is even possible to produce stable, sharp images of hot and molten metal. This is particularly useful for electron beam welding since it allows the weld-pool to be viewed continuously without deterioration of the imaging collector as would be the case for conventional light optical systems. The latter tend to deteriorate because metal vapour is evaporated from the workpiece on to the surface of light optical elements such as lenses, prisms, and mirrors. Coating of light optical elements in this way is especially troublesome where the primary beam intensity or power level is high and where copious volumes of metal vapour are produced. Coating of the light optical elements can occur even at low levels (eg. less than 750 W) where the power density is high (eg. $10^5 W/mm^2$). Alternatively for relatively high power levels (e.g. 45 kW) rapid coating of the visual optics can take place even if the power density is low (e.g. $1.5 \times 10^3 W/mm^2$) because of the large quantity of vapour produced.

In contrast the reflector and collector components of the electron image detector system are not prone to such deterioration. However, the efficiency of the reflector elements may change gradually depending on the atomic number of metal being evaporated and the base material of the reflector. On the other hand, the overall high performance of the detector is maintained over extended periods of operation since the collector(s) are completely shielded from direct line of sight of the weld-pool. In addition, the efficiency of the reflector is not unduly reduced even when appreciable deposits of metal vapour build up on the reflective surfaces since the curvature is not very critical. Moreover the electron imaging approach and use of the detectors described herein, permit both the cold workpiece and hot weld-pool to be viewed simultaneously. In comparison, for light optics the brightness range is generally too excessive either for visual or video examination.

When an electron image is produced by a single reflector and collector pair, although the range of energies of the collected electrons can be controlled to a certain extent by variation of the voltages applied to the reflector and collector electrodes, the degree of discrimination is limited. Also high voltages with respect to the workpiece potential cannot be applied to the reflector electrode because of the likelihood of shorting to ground through ionised gases and metal vapour.

The back-streaming electrons, particularly from the weld-pool, in the case of EB welding, vary in energy, dependent on their origin. The actual energy spectrum is related to the temperature and activity in the weld-pool. This information can be utilised and analysed by a detector system consisting of a multiplicity of axially arranged reflectors/collectors 41 mounted in a casing 42. Each collector acts as both a pick-up electrode and a reflector for subsequent collectors in the system, FIG. 9a and is biassed to a different potential.

By suitable signal analysis of the quantities of electrons collected by the cascaded collector electrodes, the signals can be used to build up an image in which the grey level (in the case of a black and white display) is used to indicate the temperature and activity in the weld-pool. The same information can be used to produce a synthetic colour picture of a weld-pool, in which the currents collected by the individual collectors are converted into appropriate colours. This technique can be used to re-establish artificial colour information which normally would be lost in a monochrome electron image. The data obtained can be used for process analysis, welding procedure development, and quality assurance as well as to provide real time visual displays.

For visual displays and for recording purposes the multiple collector device is particularly useful since the image brightness can be manipulated and controlled to enhance particular features of the weld-pool.

Figure 9A:
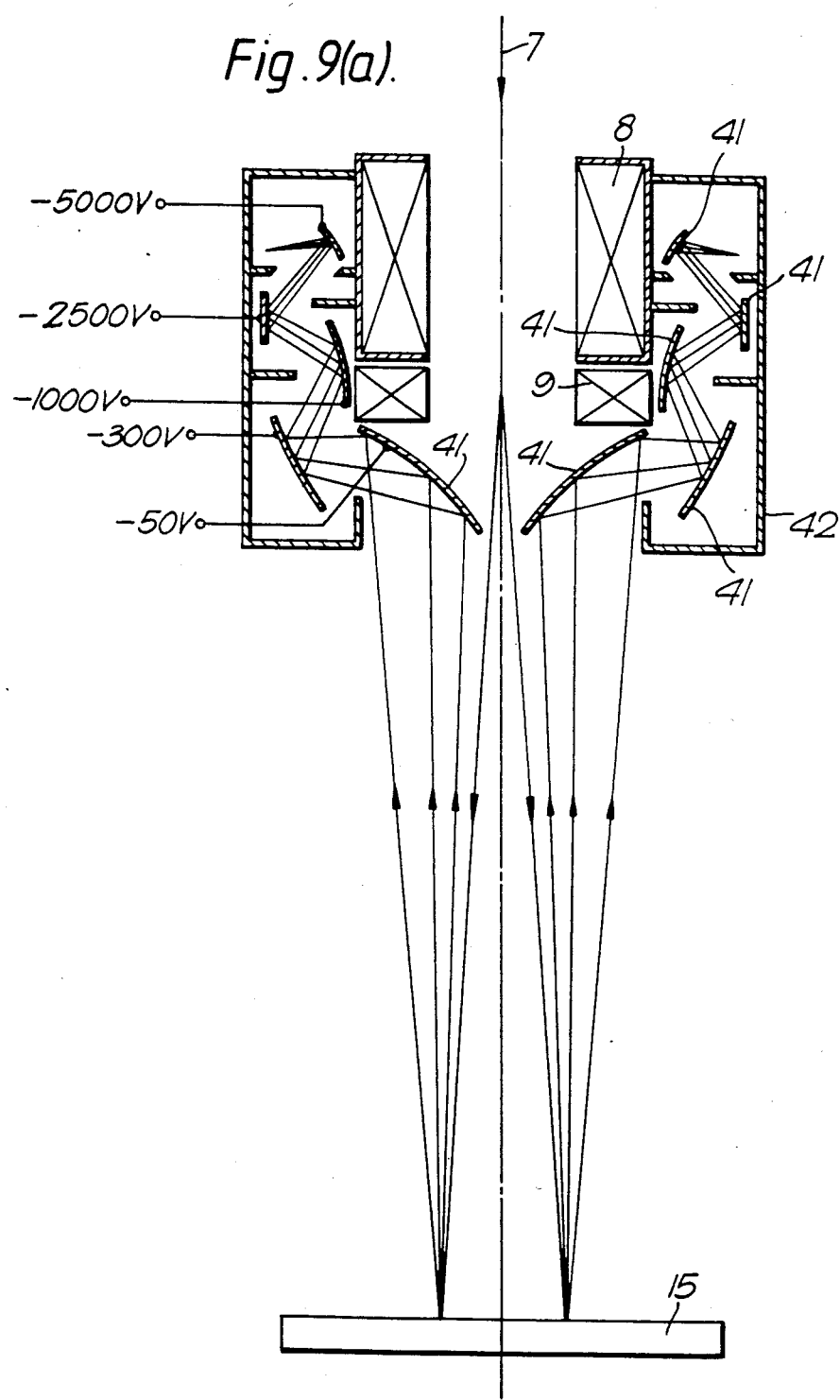
Figure 9B:
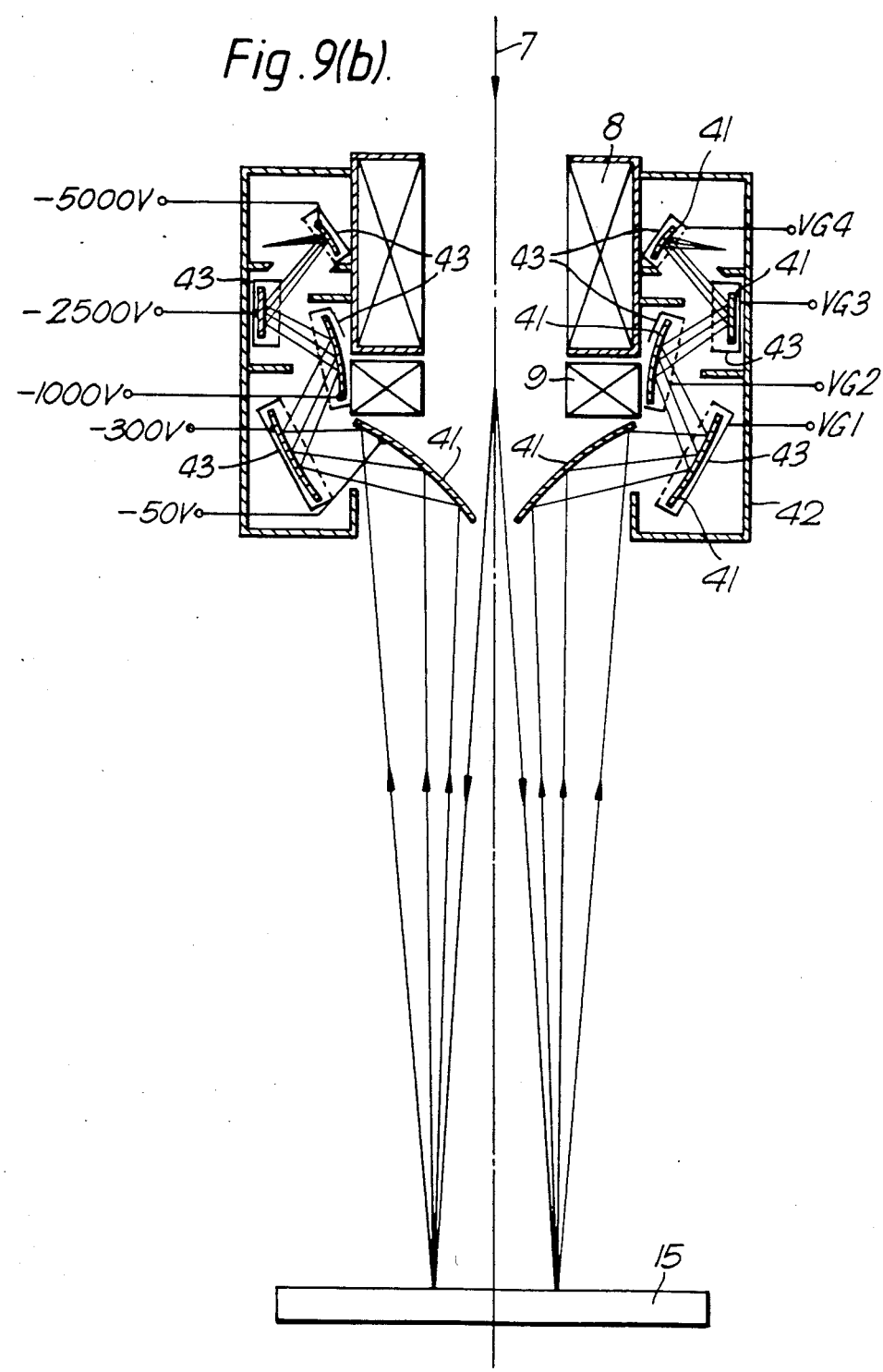

FIG. 9a shows one form of multiple collector system. Energy discrimination can also be achieved by the use of grids 43 surrounding the collectors 41 and appreciably higher biasing voltages can be applied (compared with FIG. 2) since the grids and collectors are hidden and remote from the weld-pool, FIG. 9b. In this arrangement, the grid voltages VG1, VG2, VG3, VG4 would be maintained substantially more negative than the collector plates they surround. Grids could also be used with the collectors of the examples previously described.

Figure 10:
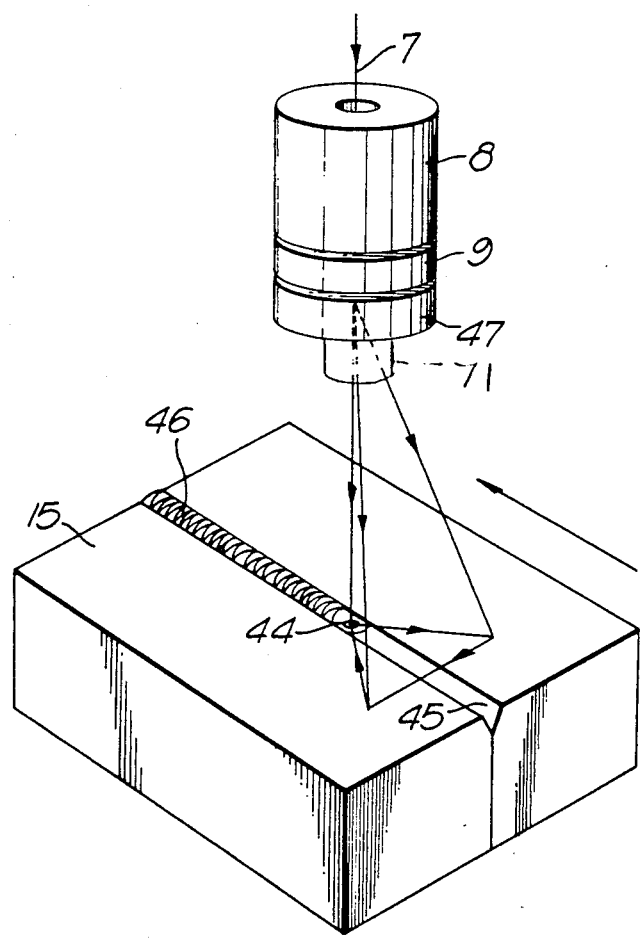
FIG. 10 illustrates movement of the electron beam during a welding cycle relative to a joint line.

For real-time seam tracking the electron beam is periodically scanned ahead of the weld-pool 44 and weld bead 46 and intersects the joint line 45, FIG. 10 which also shows a tubular magnetic shield 71. Back-scattered electrons are detected by a system according to the invention shown schematically at 47. As the beam is rapidly scanned across the joint gap (which can itself be emphasised by the addition of a groove, FIG. 10) the electron back-scatter distribution changes to produce a pulse on the collector signal level corresponding to the relative position of the joint. This pulse can then be used to act on electronic circuits which apply a corrective signal to the beam deflection system 9 or traverse motor drive units (not shown) to maintain alignment of the primary beam with the joint line.

Typically the signal collected by the detector system 47 can appear as shown in FIG. 1. The signal level can vary over a very wide range of amplitude due to the difference in the back-scattered electron current level during the scanning period compared with the welding period. During the welding period the number of electrons absorbed by the workpiece tends to be greater than during the scanning period because the weld capillary (keyhole) acts as an efficient particle trap. On the other hand, during the scanning period the electrons are strongly reflected from the solid metal surfaces since the scan speed is purposely made very high to avoid appreciable melting. Thus the back-scattered electron signal, during a period of several scans, fluctuates over a large amplitude ($\Delta V$). In addition fluctuations in the average DC level occur when one or more of the following is changed:

1. Beam current.
2. Working distance.
3. Accelerating voltage.

4. Component topography and surface finish.
5. Atomic number of workpiece constituents.
6. Welding conditions e.g. beam focus and applied process control beam oscillations.

Figure 11:
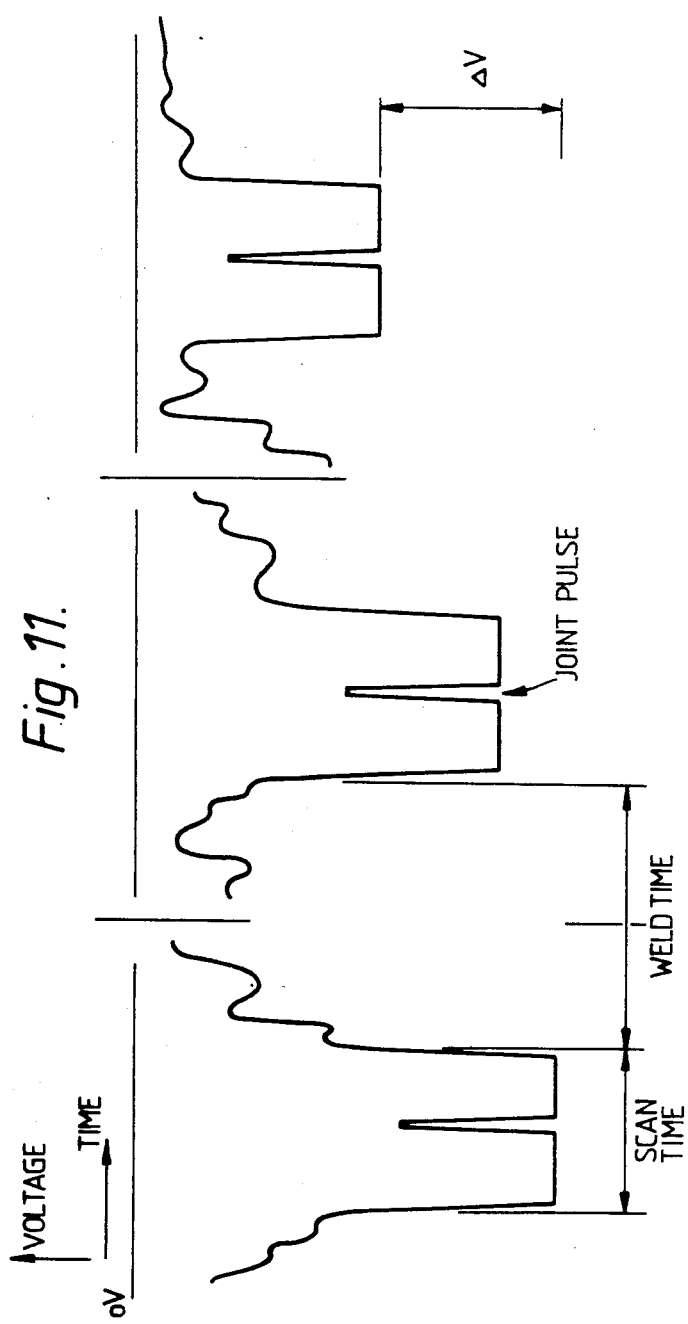
FIG. 11 illustrates graphically the output signal from the sensor of an assembly according to the invention.

Generally the frequency of the information carrying component of the collector signal is of a higher level than the random background signal fluctuations, FIG. 11.

Figure 12:
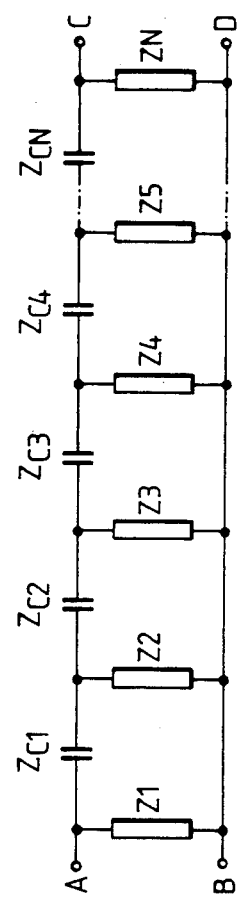
FIG. 12 is a circuit diagram of a ladder circuit.

These fluctuations in the average DC level can cause difficulties in signal processing for all of the applications mentioned. To overcome this problem a special ladder circuit has been devised, FIG. 12, consisting of a series of paired elements $Z_c$ and Z, where the $Z_c$ elements are capacitive and the Z elements are resistive or inductive. The signal from a collector plate is fed in at points A and B and is transmitted through the points C and D. The elements $Z_c$ are arranged to provide a low impedance path to the critical high frequency information arising from surface details, whilst creating a high impedance path to the low frequency background signal variations. Effectively, in the case of a capacitive-resistive network, the capacitive elements act as multiple decoupling stages, while the Z elements create a low resistance path for the remaining low frequency components. Alternatively the Z elements can be inductances which present a string of low impedance shunt paths to the low frequency components in the signal. However, in this case, tuning of the capacitive-inductive elements can be critical in order to avoid spurious resonance problems. In addition, it may not be possible to achieve an adequately wide bandwidth to accommodate changes in pulse width and shape caused by alterations in scan frequency, amplitude and joint topolographic features.

Figure 13:
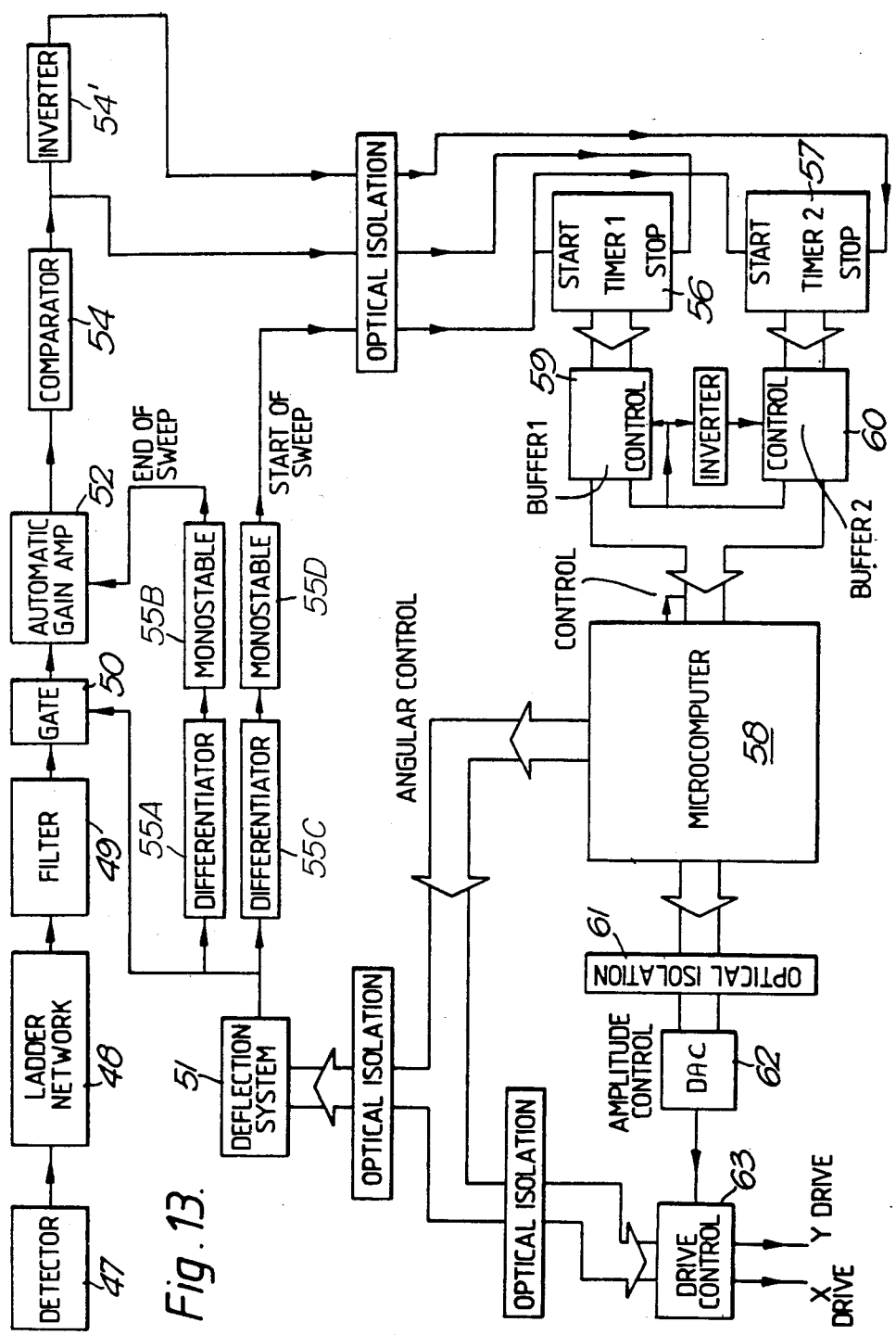
FIG. 13 is a block diagram of processing circuitry.

After the signal has been filtered by the network just described it is passed into a series of electronic processing elements as illustrated in FIGS. 13 and 14. These consist of the following main stages viz:
1. Deflection system including a control input over the angle of the line or raster scan.
2. Analogue processing and amplification.
3. Digital processing.
4. Computing ie. statistical sorting and evaluation of information from detector.
5. Motor drive circuitry to correct the beam/joint misalignment.

The deflection system periodically moves the beam over the surface of the metal ahead of the weld such that the joint is scanned, FIG. 10. The computer controls the angular orientation of the scan in relation to the weld to ensure that the sweep is perpendicular to the seam, see FIG. 15b which should be contrasted with the non-perpendicualr scan of FIG. 15a. Corrective drive is applied parallel to the scan line direction.

The signal from the collector is decoupled using a capacitor/resistor (or inductor) ladder network 48 as described above, and passed through a low pass filter 49 to remove very high frequency noise (above approximately 1 MHz). The signal is then fed into an electronic gate 50, where the gating signal is supplied by the deflection system 51 such that only the signal detected during the joint finding sweep is allowed to pass through the gate.

This signal feeds into an amplifier 52, the gain of which is controlled by the magnitude of the gated joint pulse signal. The automatic gain amplifier receives from a differentiator and monostable 55A, 55B a pulse indicating the end of sweep derived from the deflection system 51. The automatic gain amplifier 52 controls output signal amplitude such that it is maintained at a constant level independent of input signal amplitude. The input signal is integrated 52A over the scan time to produce a dc level proportional to the signal size. This value is then stored by a sample and hold element 52B. The dc level output of this device is amplified by an amplifier 52C, and used to control the gain of a circuit element 52D amplifying the input signal.

The gain of amplifier 52C is adjusted such that the output signal is maintained constant over a wide range of input signal. The output of this device is normally fed to pulse analysis circuits but may also be monitored on an oscilloscope or meter 53 to examine beam focus or generation of electron images for workpiece viewing.

A comparator 54, with a fixed voltage reference, derives a digital pulse from the analogue signal. The delay from the start of sweep to the derived digital pulse identifies the seam position along the scan. The duration of the pulse is used to discriminate between detection of a seam or some other feature e.g. a weld tack or weld spatter. The sweep start signal is derived using a differentiator 55C and monostable 55D triggered by the leading edge of the sweep pulse from the deflection system 51. To enable the computer to monitor the delay and duration of the pulse, two timers 56, 57 are used. One 56 measures from the sweep start to the leading edge of the pulse as defined by the output from comparator 54; the other 57 measures from the sweep start to the end of the pulse as defined by the inverted output from the comparator 54 (via inverter 54'). By subtracting these signals the pulse width may be obtained, which provides data for signal integrity analysis. Optical isolation between the timers and the digital signals eliminates voltage transients common in the electron beam environment which can cause hardware damage or software malfunction.

The output of the timers is linked to a computer 58 by an octal data bus. A pair of latching buffers, 59, 60 alternately enabled by a computer control signal, allows reading to be switched from one buffer to the other buffer.

During welding it is inevitable that some misinterpretation of the weld seam position will occur due to spatter, machining marks, weld tacks and other surface features. The computer software determines that a pulse is from a seam by measuring its duration and comparing the time at which the pulse appears with previous readings. Data on previous line scan readings, eg. the last 10, provides a basis for discriminating between reasonable variations and erroneous readings. When many erroneous readings occur, such that an ambiguity could arise as to actual weld seam position, the motor (or deflection systems or motors) are not driven. When sufficiently consistent and reasonable data has been established, tracking continues. During real time seam tracking the output drive is adjusted; its magnitude being proportional to the extent of misalignment, and the time between scans. The digital output from the computer is passed through an optical isolator 61 to a digital to analogue converter 62. This output drives the weld seam towards the correct position, ie. the centre of the scan line(s) via drive control 63. Sufficient corrective drive is applied to eliminate mis-alignment by the time the next scan occurs. This makes the system stable and prevents "hunting" for the joint line.

The direction of the drive is also given by the computer 58 to the drive unit and any updating of the sweep/drive angle is passed on to the deflection system 51. The deflection system has control over the angle of the scan. In welding it is necessary to keep the scan lines perpendicular to the seam (see FIG. 15). An increasing change in scan line to seam angle causes the tracking error ($\delta_1, \delta_2$) to progressively increase.

In one form of the invention the computer keeps a record of recent output drive values to the drive unit, and from these and the welding speed, the program calculates the angle between the scan line and the seam. Alternatively, a multiline scan can be used, such that angular and positional information about the seam may be obtained by examination of a succession of signals as shown in FIG. 16. The oscillogram schematics indicate the intensity of signal obtained against the time from the start of the scan. The changing time between the start of the sweep and the pulse is indicative of the angle of the seam ($\theta_1, \theta_2$). For raster lines perpendicular to the joint line ($\theta_1 = 90°$), the time from the sweep start to the pulse is the same for all the scan lines. The seam tracking system provides a self stabilising negative feedback loop through proportional corrective drive.

The collector and ladder network circuits together with the signal processing circuits of the seam tracking system, FIG. 13, up to and including the gate circuit can be used to determine the focus coil current necessary to achieve minimum primary beam diameter on the workpiece. This operation can be carried out manually whilst observing the pulse amplitude after the gate circuit as displayed on for example an oscilloscope or by monitoring the signal produced by the integrator and sample and hold circuits, FIG. 14. The highest (or narrowest) pulse indicates the sharpest focus.

The pulse height parameter can also be used as a means of assessing the consistency and reproducibility of the welding process where the beam focus is purposely set to be different to that required for beam focusing on the workpiece surface.

Typically, the beam power may be decreased during the scanning step to minimise damage to the workpiece.

We claim:

1. A charged particle collector assembly comprising a reflection member onto which charged particles impinge in use, said reflection member substantially absorbing particles of one polarity and substantially reflecting articles of the other polarity; and a sensor positioned to receive said reflected particles only after said particles have impinged on and been reflected from said reflection member and to generate a corresponding output signal.

2. An assembly according to claim 1, further comprising a shield arranged to prevent charged particles from directly impinging on said sensor.

3. An assembly according to claim 1, further comprising means for applying a potential to said reflection member having the same polarity as said particles to be reflected.

4. An assembly according to claim 1, wherein said reflector defines a concave surface onto which said beam of charged particles impinges.

5. An assembly according to claim 1, wherein said reflection member is substantially annular and formed from a number of subsidiary members.

6. A method according to claim 1 wherein said charged particles impinging on said reflection member are backscattered charged particles.

7. In combination, at least two charged particle collector assemblies, each said assembly comprising a reflection member onto which charged particles impinge in use, said reflection member absorbing particles of one polarity and substantially reflecting particles of the other polarity; and a sensor positioned to receive said reflected particles only after said particles have impinged on and been reflected from said reflection member and to generate a corresponding output signal, wherein said assemblies are nested.

8. In combination, at least two charged particle collector assemblies, each said assembly comprising a reflection member onto which charged particles impinge in use, said reflection member substantially absorbing particles of one polarity and substantially reflecting particles of the other polarity; and a sensor positioned to receive particles reflected from said reflection member and to generate a corresponding output signal, wherein said assemblies are axially aligned and wherein said sensor of an upstream assembly constitutes a reflector for the adjacent downstream assembly.

9. Charged particle beam welding apparatus incorporating at least one charged particle collector assembly comprising a reflection member onto which charged particles impinge in use, said reflection member substantially absorbing particles of one polarity and substantially reflecting particles of the other polarity; and a sensor positioned to receive said reflected particles only after said particles have impinged on and been reflected from said reflection member and to generate a corresponding output signal.

10. A method as defined by claim 9 wherein the charged particles scattered by said workpiece are backscattered charged particles.

11. A method of controlling the impingement of a beam of charged particles on a workpiece having an elongate feature, said method comprising causing relative movement between said beam and said workpiece whereby said beam impinges on successive primary positions along said elongate feature; causing said beam periodically to scan across said elongate feature at an advanced position relatively to said corresponding primary position; collecting charged particles scattered by said workpiece during the scanning step in a charged particle collector assembly comprising a reflection member onto which charged particles impinge in use, said reflection member substantially absorbing particles of one polarity and substantially reflecting particles of the other polarity; and a sensor positioned to receive reflected particles only after said particles have impinged on and been reflected frolm said reflection member and to generate a corresponding output signal; and monitoring said signal generated by said sensor of said assembly.

12. A method according to claim 11, further comprising controlling said relative movement between said beam and said workpiece in accordance with said signal generated by said sensor.

13. A method according to claim 11, wherein the power of said beam is reduced during said scanning step.

14. A method according to claim 11, further comprising causing said beam of charged particles to perform a welding operation at each primary position.

15. A method as defined by claim 11 wherein the charged particles scattered by said workpiece are backscattered charged particles.

* * * * *